United States Patent
Rohena et al.

(10) Patent No.: US 11,622,470 B2
(45) Date of Patent: Apr. 4, 2023

(54) THERMAL MANAGEMENT SYSTEM FOR PORTABLE ELECTRONIC DEVICES

(71) Applicant: Magic Leap, Inc., Plantation, FL (US)

(72) Inventors: Guillermo Padin Rohena, Coral Springs, FL (US); Mohammad Amin Godil, Ft. Lauderdale, FL (US); Anthony Wayne Cuteri, Austin, TX (US)

(73) Assignee: Magic Leap, Inc., Plantation, FL (US)

(*) Notice: Subject to any disclaimer, the term of this patent is extended or adjusted under 35 U.S.C. 154(b) by 0 days.

(21) Appl. No.: 16/885,013

(22) Filed: May 27, 2020

(65) Prior Publication Data
US 2020/0383240 A1     Dec. 3, 2020

Related U.S. Application Data

(60) Provisional application No. 62/853,613, filed on May 28, 2019.

(51) Int. Cl.
*H05K 7/20*     (2006.01)
*G02B 27/01*     (2006.01)

(52) U.S. Cl.
CPC ..... *H05K 7/20154* (2013.01); *G02B 27/0176* (2013.01); *H05K 7/20218* (2013.01); *H05K 7/20263* (2013.01); *G06F 2200/201* (2013.01)

(58) Field of Classification Search
CPC ........... H05K 7/20281; H05K 7/20154; H05K 7/20263; H05K 7/20218; G02B 27/0176; G06F 2200/201
USPC ........................................................ 361/699
See application file for complete search history.

(56) References Cited

U.S. PATENT DOCUMENTS

RE24,382 E * 10/1957 Greer ................ F15B 1/24
                                                  138/31
3,601,181 A * 8/1971 Avrea ................ F01P 11/02
                                                 165/51
4,729,089 A * 3/1988 Bench ............... G05B 19/0428
                                                165/232

(Continued)

FOREIGN PATENT DOCUMENTS

WO    WO 2020/243169     12/2020

OTHER PUBLICATIONS

International Search Report and Written Opinion, re PCT Application No. PCT/US 20/34696, dated Oct. 15, 2020.

(Continued)

*Primary Examiner* — Anatoly Vortman
(74) *Attorney, Agent, or Firm* — Seed Intellectual Property Law Group LLP

(57) ABSTRACT

A wearable electronic device is disclosed. The device can include a support structure and an electronic component disposed in or on the support structure. A heat exchanger element can be thermally coupled with the electronic component, the heat exchanger element comprising a fluid inlet port and a fluid outlet port. A first conduit can be fluidly connected to the fluid inlet port of the heat exchanger, the first conduit configured to convey, to the heat exchanger, liquid at a first temperature. A second conduit can be fluidly connected to the fluid outlet port of the heat exchanger, the second conduit configured to convey, away from the heat exchanger, liquid at a second temperature different from the first temperature.

15 Claims, 11 Drawing Sheets

(56) References Cited

U.S. PATENT DOCUMENTS

| | | | | |
|---|---|---|---|---|
| 5,383,340 A | * | 1/1995 | Larson | F28D 15/0266 257/E23.088 |
| 5,606,341 A | * | 2/1997 | Aguilera | F28D 15/0266 345/87 |
| 5,621,613 A | * | 4/1997 | Haley | G06F 1/203 165/104.33 |
| 5,757,615 A | * | 5/1998 | Donahoe | G06F 1/203 165/104.33 |
| 5,781,409 A | * | 7/1998 | Mecredy, III | F28D 15/02 16/223 |
| 5,832,987 A | * | 11/1998 | Lowry | F28F 13/00 165/86 |
| 5,910,883 A | * | 6/1999 | Cipolla | G06F 1/203 361/679.27 |
| 6,209,315 B1 | * | 4/2001 | Weigl | F01N 11/00 60/274 |
| 6,850,221 B1 | | 2/2005 | Tickle | |
| 7,212,405 B2 | * | 5/2007 | Prasher | H01L 23/473 257/E23.098 |
| 7,791,876 B2 | * | 9/2010 | Moore | G06F 1/203 361/679.53 |
| 7,978,474 B2 | * | 7/2011 | Ali | G06F 1/203 361/700 |
| 8,432,691 B2 | * | 4/2013 | Toftloekke | H05K 7/20254 361/698 |
| 8,611,083 B2 | * | 12/2013 | Kumlin | G06F 1/20 361/679.53 |
| 9,081,426 B2 | | 7/2015 | Armstrong | |
| 2002/0075645 A1 | * | 6/2002 | Kitano | G06F 1/203 361/679.53 |
| 2004/0001310 A1 | | 1/2004 | Chu et al. | |
| 2004/0132171 A1 | | 7/2004 | Rule et al. | |
| 2005/0068724 A1 | * | 3/2005 | Pokharna | F28D 15/0266 361/679.21 |
| 2005/0241803 A1 | * | 11/2005 | Malone | G06F 1/20 165/80.4 |
| 2006/0028436 A1 | | 2/2006 | Armstrong | |
| 2006/0144568 A1 | * | 7/2006 | Crocker | F04D 29/186 165/104.33 |
| 2007/0081123 A1 | | 4/2007 | Lewis | |
| 2012/0127062 A1 | | 5/2012 | Bar-Zeev et al. | |
| 2012/0162549 A1 | | 6/2012 | Gao et al. | |
| 2013/0082922 A1 | | 4/2013 | Miller | |
| 2013/0117377 A1 | | 5/2013 | Miller | |
| 2013/0125027 A1 | | 5/2013 | Abovitz | |
| 2013/0208234 A1 | | 8/2013 | Lewis | |
| 2013/0242262 A1 | | 9/2013 | Lewis | |
| 2014/0071539 A1 | | 3/2014 | Gao | |
| 2014/0177023 A1 | | 6/2014 | Gao et al. | |
| 2014/0218468 A1 | | 8/2014 | Gao et al. | |
| 2014/0267420 A1 | | 9/2014 | Schowengerdt | |
| 2015/0016777 A1 | | 1/2015 | Abovitz et al. | |
| 2015/0103306 A1 | | 4/2015 | Kaji et al. | |
| 2015/0178939 A1 | | 6/2015 | Bradski et al. | |
| 2015/0205126 A1 | | 7/2015 | Schowengerdt | |
| 2015/0309263 A2 | | 10/2015 | Abovitz et al. | |
| 2015/0326570 A1 | | 11/2015 | Publicover et al. | |
| 2015/0346495 A1 | | 12/2015 | Welch et al. | |
| 2016/0011419 A1 | | 1/2016 | Gao | |
| 2016/0026253 A1 | | 1/2016 | Bradski et al. | |
| 2016/0377328 A1 | | 12/2016 | Hurbi | |
| 2018/0036703 A1 | | 5/2018 | Woods et al. | |
| 2018/0348826 A1 | | 12/2018 | Aguirre | |
| 2020/0033921 A1 | | 1/2020 | Rohena et al. | |

OTHER PUBLICATIONS

ARTooiKit: https://web.archive.org/web/20051013062315/http://www.hitl.washington.edu:80/artoolkit/documentation/hardware.htm, archived Oct. 13, 2005.

Azuma, "a Survey of Augmented Reality," Teieoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

THERMAL MANAGEMENT SYSTEM FOR PORTABLE ELECTRONIC DEVICES

PRIORITY CLAIM

This application claims the benefit of priority under 35 U.S.C. § 119(e) of U.S. Provisional Application No. 62/853,613 filed on May 28, 2019. The entire disclosure of each of this priority document is incorporated herein by reference.

BACKGROUND

Field

The field relates to a thermal management system for portable electronic devices.

Description of the Related Art

In various types of portable electronic devices, it can be challenging to sufficiently dissipate heat that is generated by on-board electronics, the power supply (e.g., batteries), or other electronic components that act as heat sources. It can be desirable to improve the dissipation of heat in electronic devices.

For example, in some embodiments, modern computing and display technologies have facilitated the development of systems for virtual reality and/or augmented reality experiences, wherein digitally reproduced images or portions thereof are presented to a user in a manner wherein they seem to be, or may be perceived to be, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

Some VR or AR systems may include portable electronic devices that may be subject to the thermal loads that may be uncomfortable to the user or that may damage the components of the system. Accordingly, there remains a continuing need for improved thermal solutions for portable (e.g., wearable) electronic devices, including those used in conjunction with VR or AR systems.

SUMMARY

Various embodiments disclosed herein relate to thermal management systems for wearable or portable electronic devices, such as for wearable VR or AR systems. Various types of wearable electronic devices include processors and other components that generate heat. Such heat generation can increase the temperature of the electronic device, which may generate discomfort for the user, and/or may negatively affect the operation of the electronic device(s). Various embodiments disclosed herein include a thermal management system that includes a liquid cooling apparatus including liquid conduit(s) and heat exchanger(s) configured to remove heat from the device so as to improve user experience and/or device operation.

In one embodiment, a wearable electronic device is disclosed. The wearable electronic device can include a support structure. The wearable electronic device can include an electronic component disposed in or on the support structure. The wearable electronic device can include a heat exchanger element thermally coupled with the electronic component, the heat exchanger element comprising a fluid inlet port and a fluid outlet port. The wearable electronic device can include a first conduit fluidly connected to the fluid inlet port of the heat exchanger, the first conduit configured to convey, to the heat exchanger, liquid at a first temperature. The wearable electronic device can include a second conduit fluidly connected to the fluid outlet port of the heat exchanger, the second conduit configured to convey, away from the heat exchanger, liquid at a second temperature different from the first temperature.

In another embodiment, a cooling system for a portable device is disclosed. The cooling system can include a heat generating element and a heat transfer system. The heat transfer system can include a heat exchanger disposed adjacent to the heat generating element, a radiator, a fan disposed adjacent to the radiator, a heat transfer circuit in fluid communication with the heat exchanger and the radiator, and a pump in fluid communication with the heat transfer circuit. The cooling system can include a motor having an output shaft coupled with at least one of the fan and the pump.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Figure 1:
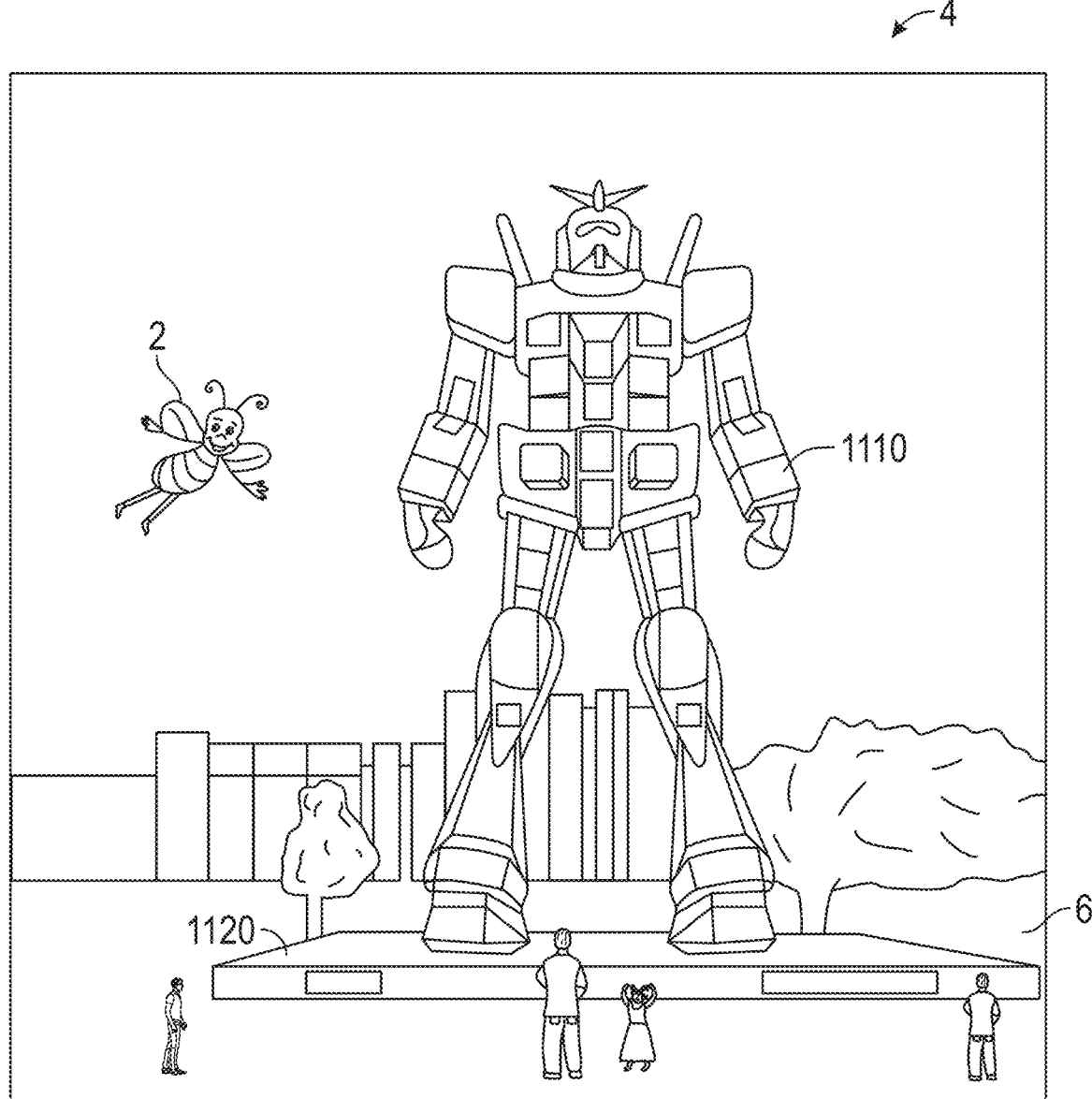
FIG. 1 depicts an illustration of an augmented reality scenario with certain virtual reality objects, and certain physical objects viewed by a person.

Various embodiments disclosed herein relate to a portable (e.g., wearable) electronic device. For example, in FIG. 1 an augmented reality scene 4 is depicted wherein a user of an AR technology sees a real-world park-like setting 6 featuring people, trees, buildings in the background, and a concrete platform 1120. In addition to these items, the user of the AR technology also perceives that he "sees" a robot statue 1110 standing upon the real-world platform 1120, and a cartoon-like avatar character 2 flying by which seems to be a personification of a bumble bee, even though these elements 2, 1110 do not exist in the real world. At least the elements 2, 1110 can be provided to the user at least in part by the portable (e.g., wearable) electronic devices disclosed herein. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a real bat communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches do not perform localization at satisfactory speed or precision standards.

Thus, there is a need for a better localization system in the context of AR and VR devices. Moreover, the continual and/or rapid movement of users can introduce various other problems into the electrical, thermal, and/or mechanical systems of such AR and/VR devices. In addition, the use of processor(s) and other heat generation components may be uncomfortable to the user, or may otherwise reduce the performance of the system. For example, the processor(s) and other heat source(s) may be located in a headset near the skin of the user, which may generate discomfort for the user during operation of the system. Accordingly, it can be important to provide improved thermal management systems for AR and VR devices.

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
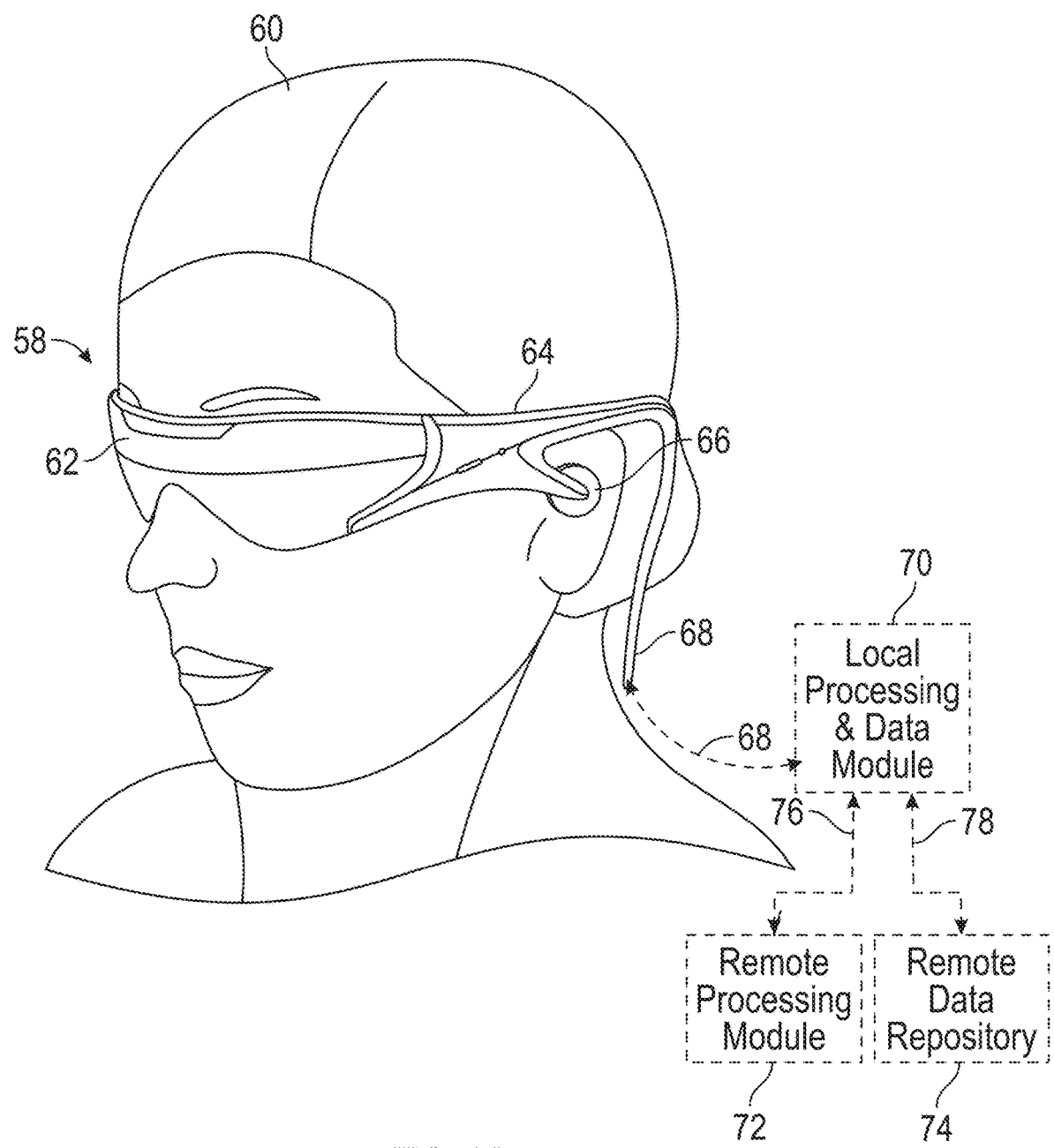
FIGS. 2A-2D schematically illustrate examples of a wearable system, according to various embodiments.
Figure 2B:
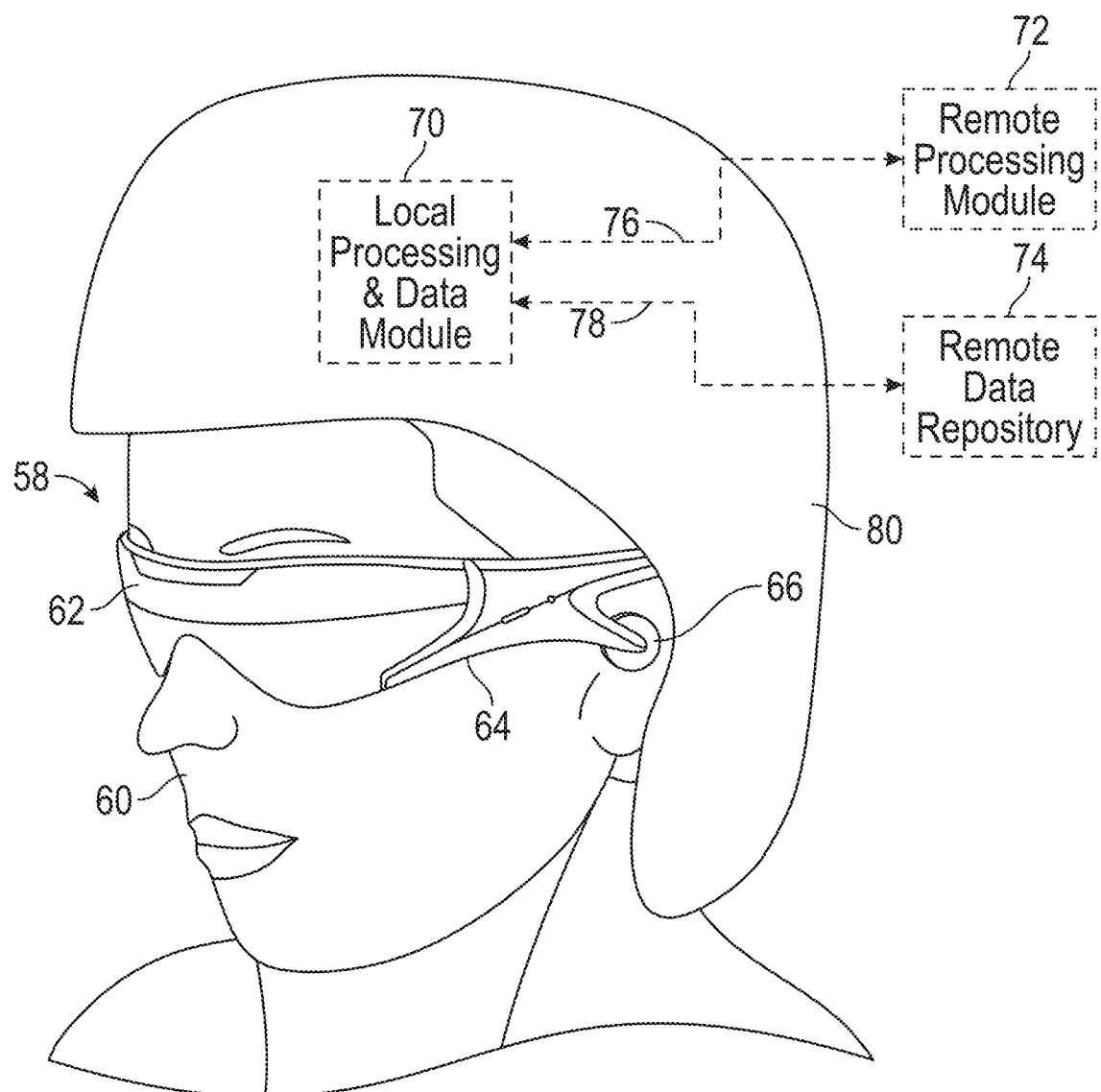
Figure 2C:
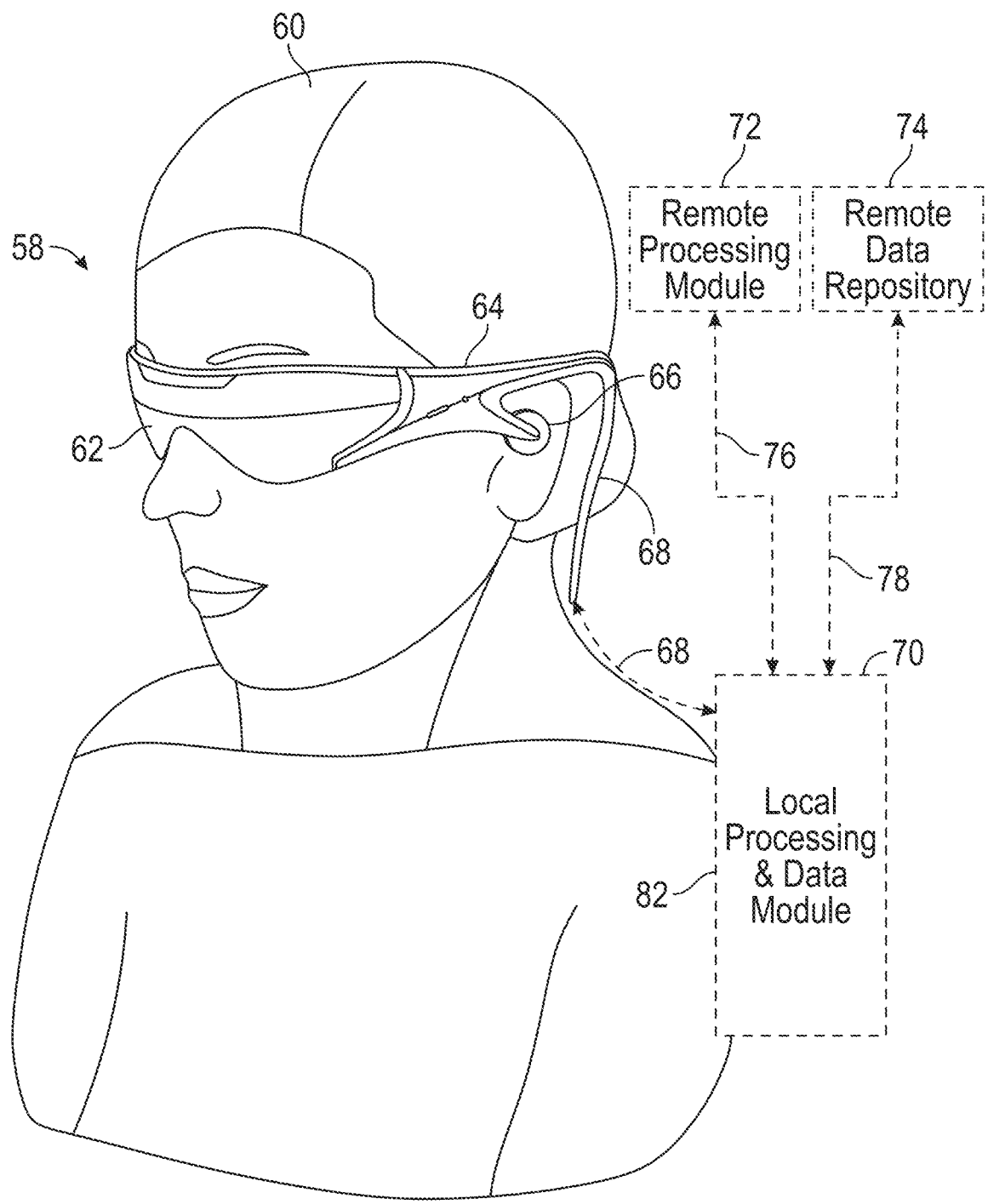
Figure 2D:
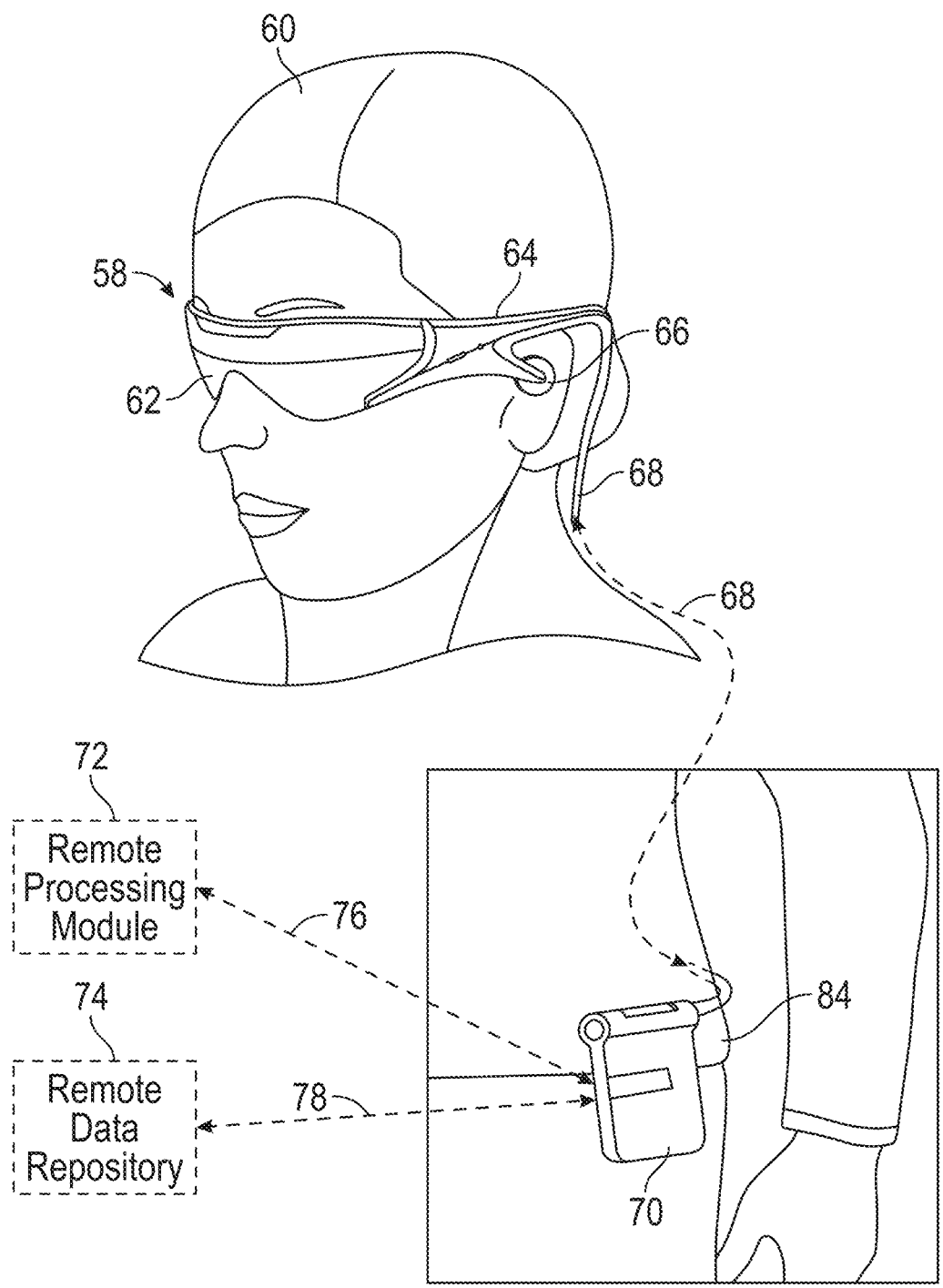

As shown in FIG. 2A, an AR system user 60 is depicted wearing head mounted component 58 featuring a frame 64 structure coupled to a display system 62 positioned in front of the eyes of the user. A speaker 66 is coupled to the frame 64 in the depicted configuration and positioned adjacent the ear canal of the user (in one embodiment, another speaker, not shown, is positioned adjacent the other ear canal of the user to provide for stereo/shapeable sound control). The display 62 is operatively coupled 68, such as by a wired lead or wireless connectivity, to a local processing and data module 70 which may be mounted in a variety of configurations, such as fixedly attached to the frame 64, fixedly attached to a helmet or hat 80 as shown in the embodiment of FIG. 2B, embedded in headphones, removably attached to the torso 82 of the user 60 in a backpack-style configuration as shown in the embodiment of FIG. 2C, or removably attached to the hip 84 of the user 60 in a belt-coupling style configuration as shown in the embodiment of FIG. 2D.

The local processing and data module 70 may comprise a power-efficient processor or controller, as well as digital memory, such as flash memory, both of which may be utilized to assist in the processing, caching, and storage of data a) captured from sensors which may be operatively coupled to the frame 64, such as image capture devices (such as cameras), microphones, inertial measurement units, accelerometers, compasses, GPS units, radio devices, and/or gyros; and/or b) acquired and/or processed using the remote processing module 72 and/or remote data repository 74, possibly for passage to the display 62 after such processing or retrieval. The local processing and data module 70 may be operatively coupled 76, 78, such as via a wired or wireless communication links, to the remote processing module 72 and remote data repository 74 such that these remote modules 72, 74 are operatively coupled to each other and available as resources to the local processing and data module 70.

In one embodiment, the remote processing module 72 may comprise one or more relatively powerful processors or controllers configured to analyze and process data and/or image information. In one embodiment, the remote data repository 74 may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Figure 3A:
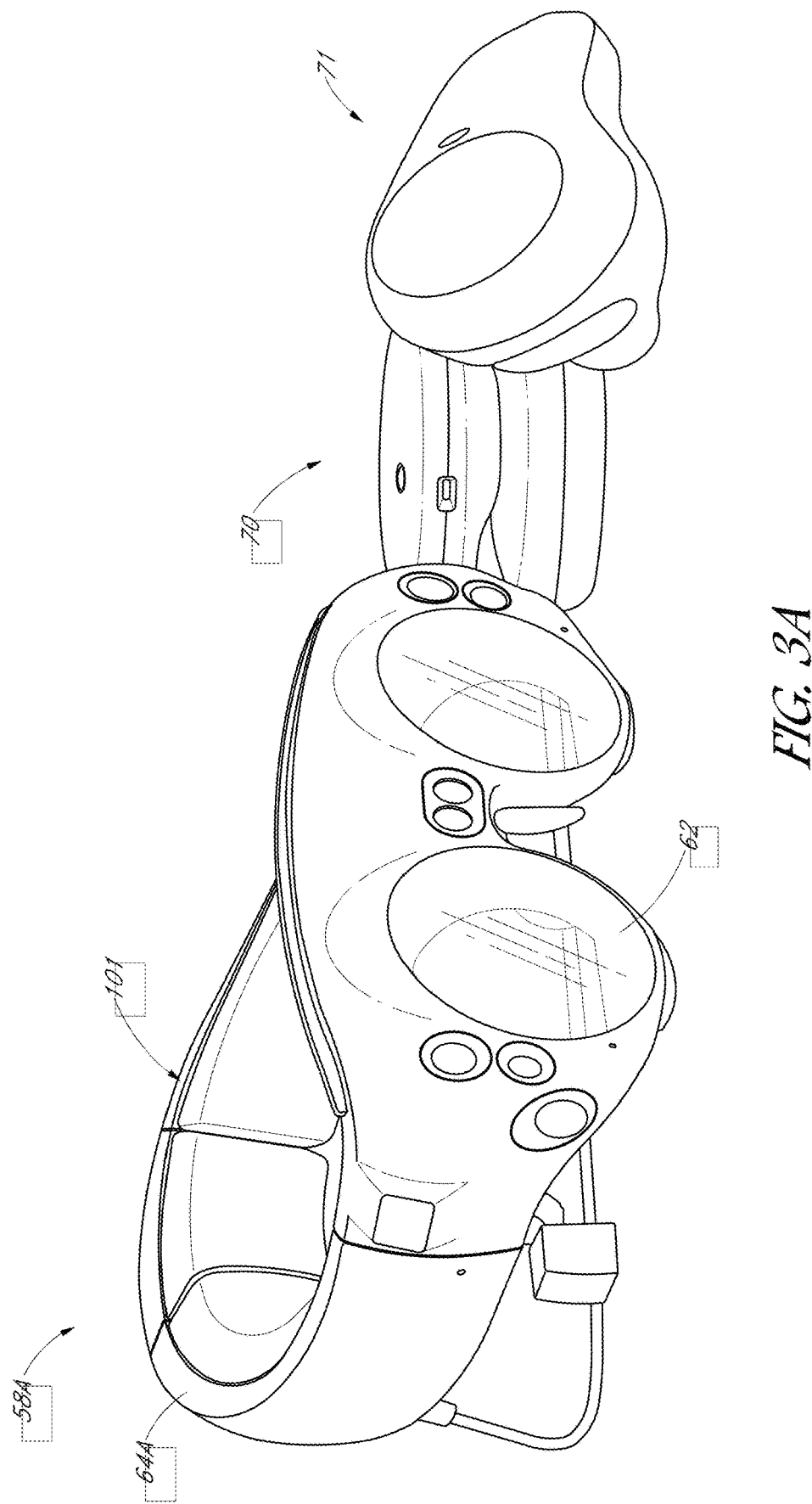
FIGS. 3A-3C illustrate a head mounted component and a local processing and data module, according to various embodiments.
Figure 3C:
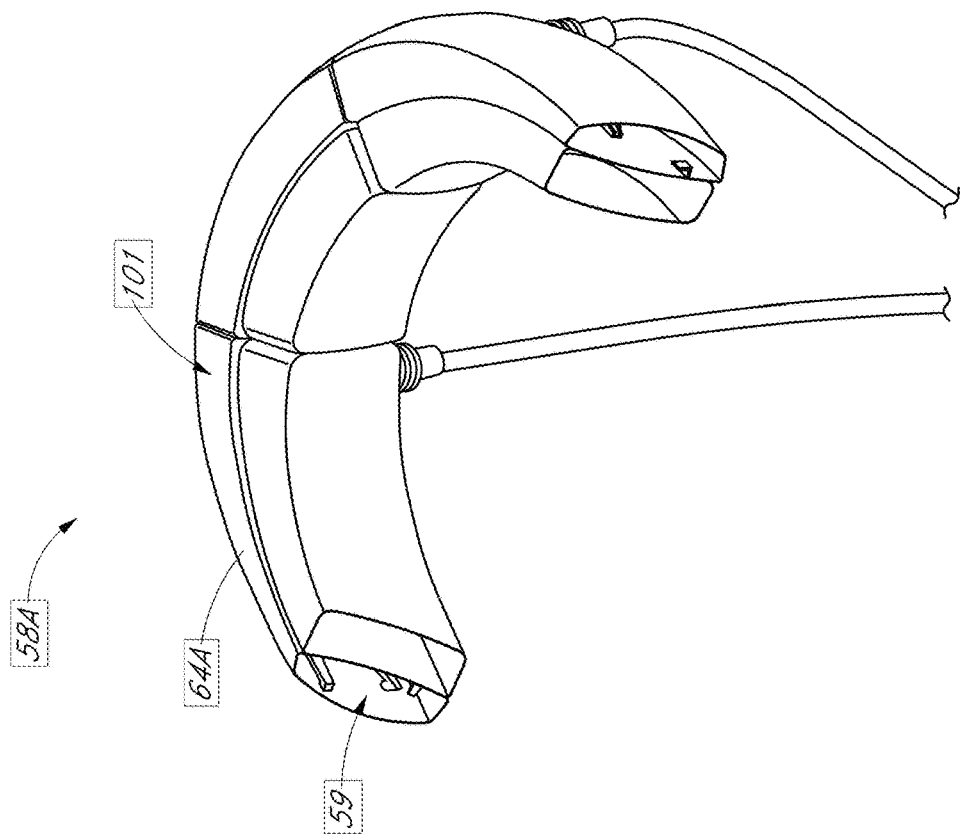
Figure 3B:
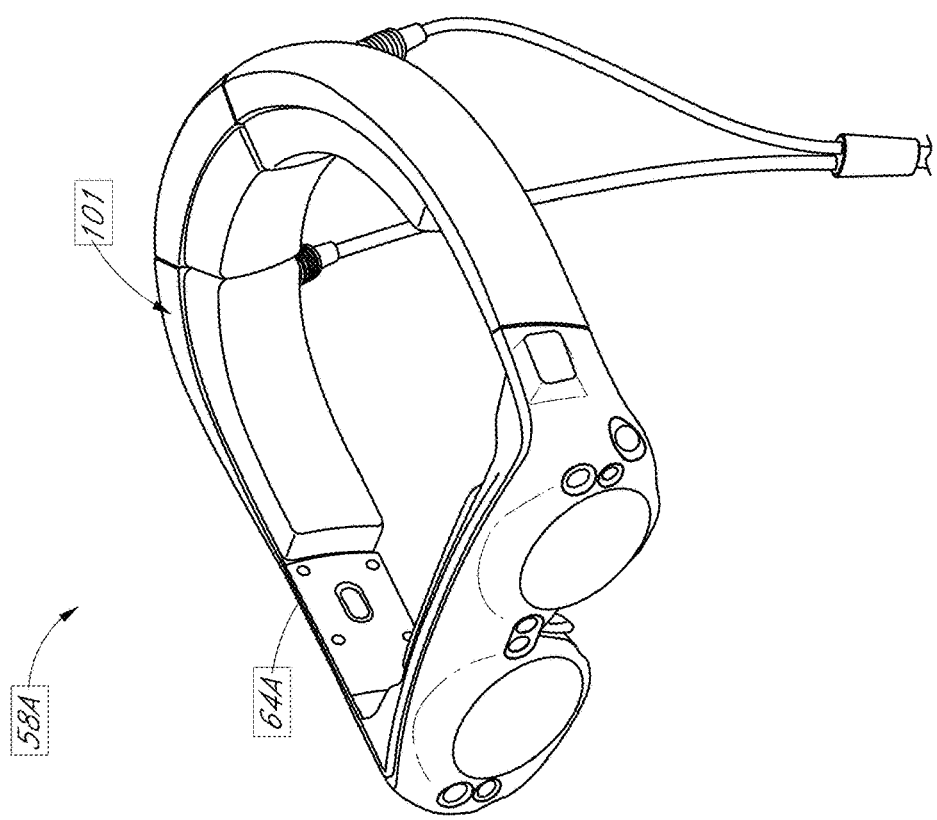

FIGS. 3A and 3B illustrates one embodiment of a head mounted component 58A and a local processing and data module 70. FIG. 3A also illustrates a handheld controller 71 configured to manipulate the system during an AR or VR experience. FIG. 3C is a schematic perspective sectional view of the component 58A shown in FIG. 3B. Unless otherwise noted, features of FIG. 3A may be the same as or generally similar to like-numbered components of FIGS. 1-2D. The devices shown in FIGS. 3A-3B illustrate the Magic Leap One system sold by Magic Leap, Inc., of Plantation, Fla. However, the embodiments disclosed herein can be used with any type of portable (e.g., wearable) electronic device. The frame 64A of the head mounted component 58A may be part of a support structure 101. The support structure 101 may comprise one or more cavities 59 therein. Various types of electronic components, power supplies, and other devices may be mounted on or within the support structure 101, for example, within the one or more cavities 59. As explained herein, these devices on or within the support structure 101 may generate heat, e.g., may act as heat sources. The heat generated by these devices may be uncomfortable for the user, or may otherwise negatively affect the system's operation. Accordingly, there remains a continuing need for improved heat dissipation techniques for the head mounted component 58A. Similarly, in various embodiments, the electronic components of the local processing and data module 70 may generate heat, which may be uncomfortable for the user or may otherwise affect the operation of the system. The embodiments disclosed herein can accordingly be used to improve thermal dissipation in the head mounted component 58A, the local processing and data module 70, or both. Indeed, the embodiments disclosed herein can be used for any suitable type of portable (e.g., wearable) electronic device.

Examples of Thermal Management Systems

Figure 4:
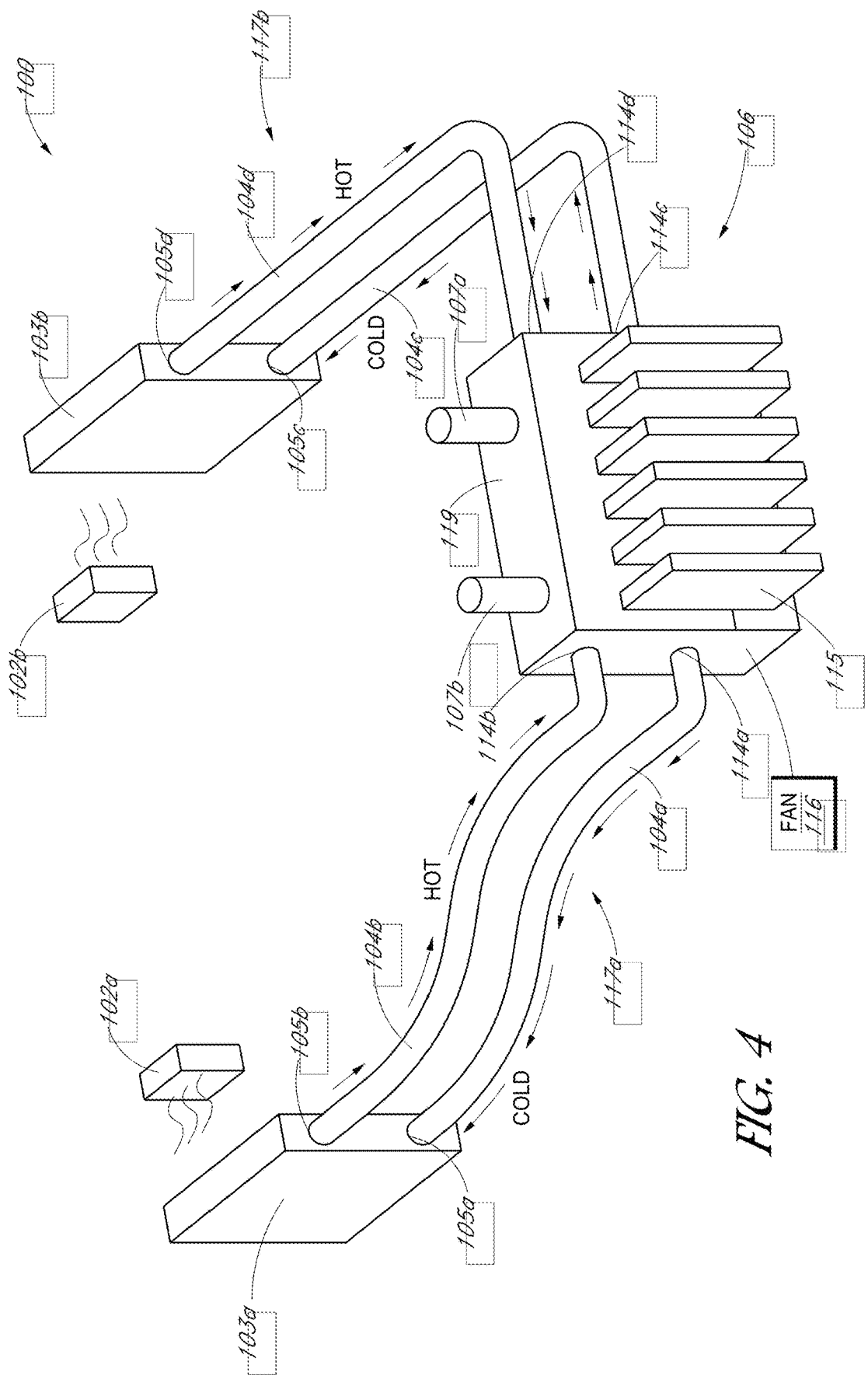
FIG. 4 is a schematic system view of a thermal management system, according to one embodiment.

FIG. 4 is a schematic system view of a thermal management system 100, according to one embodiment. The thermal management system 100 can be disposed in or on the support structure 101 of the head mounted component 58 or 58A. For example, in some embodiments, the thermal management system 100 can be disposed in the one or more cavities 59 of the enclosure 101. In other embodiments, the thermal management system 100 can be disposed in or on the local processing and data module 70, in or on the handheld controller 71, and/or on any other suitable type of portable (e.g., wearable) electronic device. As explained above, various heat sources (such as electronic components 102a, 102b) may be disposed in or on the support structure 101, e.g., within the one or more cavities 59. The electronic components 102a, 102b generate heat, which may make the user uncomfortable or otherwise negatively affect system performance. The electronic components 102a, 102b can be any type of component or device that generates heat. For example, the electronic components 102a, 102b can comprise processor(s), optical emitters (e.g., light emitting diodes, or LEDs), a projector, a power supply, or any other type of component that generates heat. Although two electronic components 102a, 102b are shown in FIG. 4, it should be appreciated that any number of electronic components may be coupled with the support structure 101.

To convey heat away from the electronic components 102a, 102b, the electronic components 102a, 102b can be thermally coupled with corresponding first and second heat exchanger elements 103a, 103b. For example, the electronic component 102a can be thermally attached to the first heat exchanger element 103a by way of a thermal conductive media such as a thermal adhesive (e.g., a thermal interface material, or TIM). The electronic component 102b can be thermally attached to the second heat exchanger element 103b by way of a thermal conductive media (such as a TIM). The first and second heat exchangers 103a, 103b can include cavity structures or chambers configured to transfer heat from the electronic components 102a, 102b to a liquid cooling system that conveys the heat away from the electronic components 102a, 102b and the heat exchangers 103a, 103b. For example, in various embodiments, the first and second heat exchangers 103a, 103b can include internal geometry such as winding channels, cavities, or pins configured to increase or maximize the area of heat transfer between fluids.

As shown in FIG. 4, the first and second heat exchangers 103a, 103b can be in fluid communication with a collection radiator 106 that is configured to dissipate the thermal energy collected by the heat exchangers 103a, 103b to the outside environs (e.g., ambient air). In some embodiments, the collection radiator 106 can be positioned on the support structure 101 so as to be located at or near the back side of the user's head when worn. A first conduit 104a can fluidly connect a first fluid inlet port 105a of the first heat exchanger 103a to a corresponding first port 114a of the collection radiator 106. The conduits 104a, 104b may be disposed in or on the enclosure 101, e.g., within the one or more cavities 59 in some embodiments. In other embodiments, the conduits 104a, 104b may be at least partially exposed to the outside environs. A second conduit 104b can fluidly connect a first fluid outlet port 105b of the first heat exchanger 103a to a corresponding second port 114b of the collection radiator 106. A third conduit 104c can fluidly connect a first fluid inlet port 105c of the second heat exchanger 103b to a corresponding third port 114c of the collection radiator 106. A fourth conduit 104d can fluidly connect a first fluid outlet port 105d of the second heat exchanger 103b to a corresponding fourth port 114d of the collection radiator 106.

The collection radiator 106 can comprise internal pipes or conduits configured to transfer heat collected from the first and second heat exchanger elements 103a, 103b to the outside environs, e.g., air. For example, the collection radiator 106 can comprise a plurality of pins or fins 115 that increase the surface area exposed to air to thereby improve heat dissipation to the outside environs (for example, by way of openings within the support structure 101). The collection radiator 106 can also include a fill port 107a and a vent 107b. the collection radiator 106 can be filled with a cooling fluid or coolant by supplying the cooling fluid to the fill port 107a. The vent 107b (which can comprise a one-way vent in some embodiments) can be configured to allow air to escape from the collection radiator 106 during filling. After the radiator 106 is filled with the cooling fluid, the fill port 107a and vent 107b can be sealed or otherwise closed. As explained below in connection with FIGS. 5-6, an accumulator can also be provided along the fluid pathway of the system to prevent gases or bubbles from forming in the cooling liquid. In some embodiments, a fan 116 may be provided to accelerate the airflow over the fins 115 to improve heat dissipation away from the collection radiator 106. In various embodiments, the fan 116 may be provided in or on the enclosure 101, e.g., within the one or more cavities 59. In some embodiments, air can flow into the cavities 59 through an intake port and can convey heat away from the components through an outlet port. In other embodiments, no fan may be provided in the thermal management system 100. In some embodiments, the collection radiator 106 or a portion thereof (e.g., fins 115 of the radiator 106) can be oriented away from the body of the user (e.g., away from the user's head) so that heat can be transferred away from the user. In various embodiments, the fins 115 can be exposed to ambient air to enhance cooling. In some embodiments, the portion of the thermal management system opposite the fins 115, such as support block 119, can be selected so as to insulate the user's body from heat collected by the radiator 106.

Moreover, as explained and illustrated below in connection with FIG. 6, a pump and a motor that drives the pump may also be provided (not shown in FIG. 4). The motor can be activated by suitable electronics to drive the pump, which in turn can drive the liquid through the conduits 104a-104d and the heat exchanger elements 103a, 103b. In some embodiments, an output shaft of the motor can be coupled with the fan 116 and the pump to simultaneously rotate the fan 116 to generate airflow over the radiator 106 and the pump to flow a liquid through the heat exchanger(s) 103a or 103b and the radiator 106. In some embodiments, a clutching mechanism or switching mechanism can be provided such that the system can separately drive the fan 116 and the pump when the fan 116 and the pump share a common motor shaft and motor. In some embodiments, the fan 116 and the pump may each have an associated motor for separately driving the fan 116 and pump. Further, in some embodiments, the radiator 106 can comprise an active cooling sink, such as active or forced air flow over extended surface areas (e.g., fins or pins).

The thermal management system 100 shown in FIG. 4 is an example of a balanced thermal system. For example, as shown in FIG. 4, a first thermal pathway 117a (e.g., including the conduits 104a, 104b) can convey heat from the first heat exchanger element 103a to the collection radiator 106. A second thermal pathway 117b (e.g., including the conduits 104c, 104d) can convey heat from the second heat exchanger element 103b to the collection radiator 106. In FIG. 4, the first and second thermal pathways 117a, 117b are at least partially and in some cases completely thermally independent or isolated from one another. The pathway 117b can be independent of the pathway 117a at least between the radiator 106 and the heat exchanger elements with which they are coupled respectively. This can provide advantages of allowing the amount of heat to be removed from each electronic component 102a, 102b to be independently addressed. For example, in FIG. 4, the amount of heat collected by the first heat exchanger element 103a and transferred to the radiator 106 may be independent from the amount of heat collected by the second heat exchanger element 103b and transferred to the radiator 106.

During operation, a pump (not shown in FIG. 4, see FIG. 5) can drive liquid (e.g., a coolant) in the thermal management system 100 along the first conduit 104a to the first heat exchanger element 103a by way of the first fluid inlet port 105a. The liquid can be routed within the first heat exchanger element 103a to the second conduit 104b by way of the first fluid outlet port 105a (and any additional conduits or tubing within the first heat exchanger element 103a. Thus, cool or cold liquid can be supplied at a first temperature to the first heat exchanger element 103a along the first conduit 104a. The heat generated by the electronic component 102a (which can act as a heat source) can increase the temperature of the liquid to a second temperature that is greater than the first temperature. It should be appreciated that although the heat source of FIG. 4 includes an electronic component 102a, in other embodiments, the heat source can comprise any other suitable device or system that generates unwanted thermal energy. The resulting warm or hot liquid at the second temperature can be conveyed away from the first heat exchanger element 103a to the collection radiator 106 along the second conduit 104b. The cooling liquid can comprise any suitable type of coolant, including, e.g., a solution comprising water and propylene glycol. The pump in the thermal management system 100 can be integrated either physically or functionally into the collection radiator 106. For example the pump can be housed in the support block 119 in one embodiment or can be separately housed as is illustrated in connection with the system 200 discussed below.

Similarly, the pump (or another pump) discussed above can drive liquid (e.g., a coolant) along the third conduit 104c to the second heat exchanger element 103b by way of the fluid inlet port 105c of the second heat exchanger element 103b. The liquid can be routed within the second heat exchanger element 103b to the fourth conduit 104d by way of the fluid outlet port 105d (and any additional conduits or tubing within the second heat exchanger element 103b. Thus, cool or cold liquid can be supplied at a first temperature to the second heat exchanger element 103*b* along the third conduit 104*c*. The heat generated by the electronic component 102*b* (which can act as a heat source) can increase the temperature of the liquid to a second temperature that is greater than the first temperature. The resulting warm or hot liquid at the second temperature can be conveyed away from the second heat exchanger element 103*b* to the collection radiator 106 along the fourth conduit 104*d*.

The warm or hot liquid at the second temperature(s) may pass through one or more conduits in the collection radiator 106. Thermal energy from the warm or hot liquid can be transferred to the fins 115 of the radiator 106, and from the fins 115 to air. As explained above, in some embodiments, the fan 116 can enhance the dissipation of heat from the fins 115 by accelerating the airflow over the fins 115.

Beneficially, the thermal management system 100 shown in FIG. 4 can reduce the temperature substantially so as to maintain user comfort and system performance. For example, the thermal management system 100 can maintain the surface temperature of the head mounted component 58, 58A at a level below a predetermined maximum temperature threshold. In some embodiments, the surface temperature of the head mounted component 58, 58A can be maintained at a temperature of at least 10° C. less than the predetermined maximum temperature threshold. In some embodiments, the surface temperature of the head mounted component 58, 58A can be maintained at a temperature of at least 12° C. less than the predetermined maximum temperature threshold. In some embodiments, the surface temperature of the head mounted component 58, 58A can be maintained at a temperature of at least 18° C. less than the predetermined maximum temperature threshold, for example, when the system 100 includes a fan to improve heat dissipation. Accordingly, in various embodiments, the surface temperature of the head mounted component 58, 58A can be maintained at a temperature in a range of 10° C. to 25° C. less than the predetermined maximum threshold temperature. In some embodiments, the thermal management system 100 can reduce the temperature to slightly above ambient temperature, e.g., to a temperature of 1° C. to 5° C. above ambient temperature (e.g., room temperature). In various embodiments, the thermal management system 100 can be configured to dissipate thermal energy approximately equal to the thermal energy produced by the heat-generating components (such as the components 102*a*, 102*b*), such that the thermal loop is close to or approximately energy-neutral.

Moreover, the thermal management system 100 can advantageously be provided in a small form factor suitable for use in a portable (e.g., wearable) electronic device.

Figure 5:
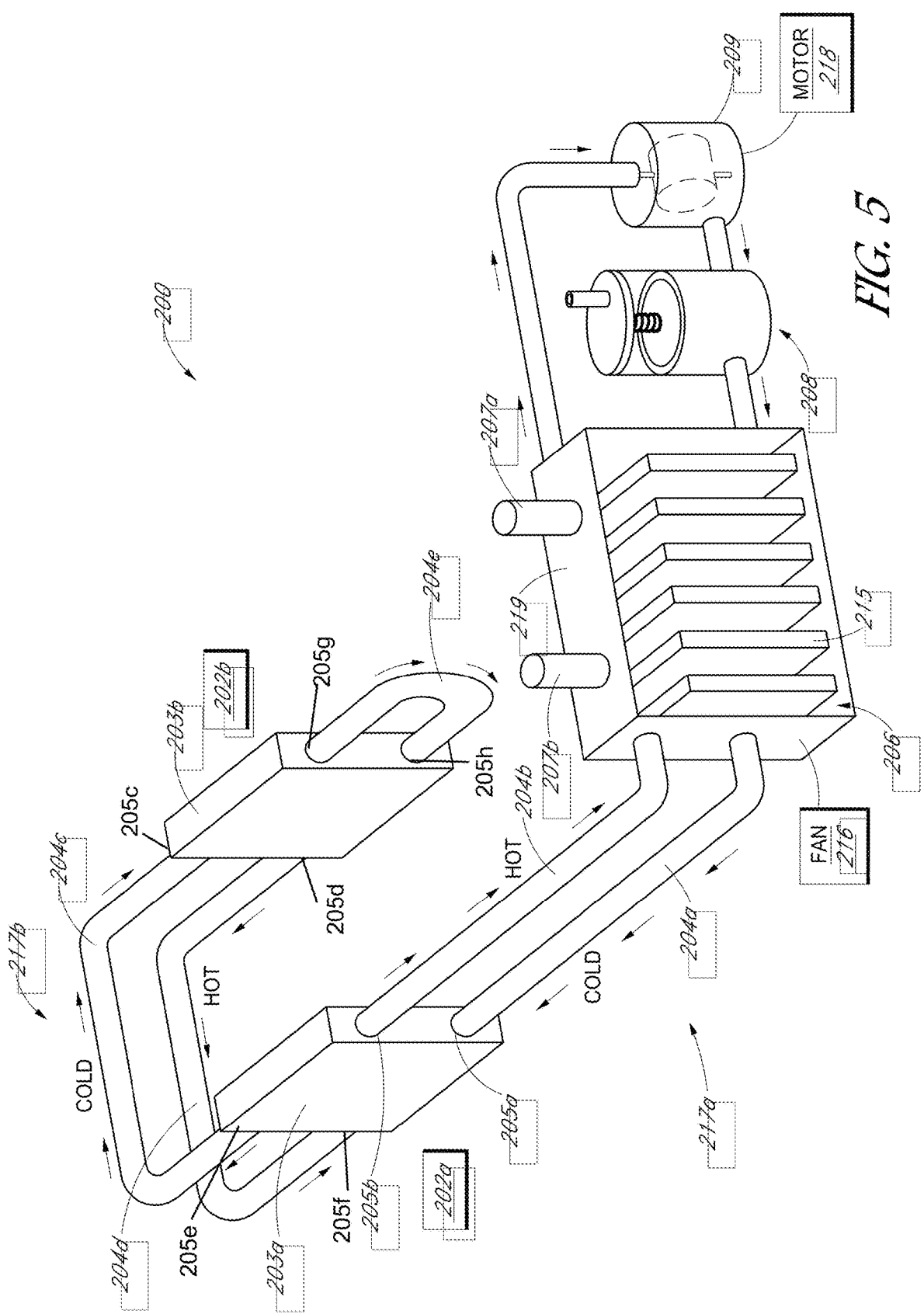
FIG. 5 is a schematic system view of a thermal management system, according to another embodiment.

FIG. 5 is a schematic system view of a thermal management system 200, according to another embodiment. Unless otherwise noted, the components of FIG. 5 may be generally similar to or the same as like numbered components of FIG. 4, with the reference numerals incremented by 100 relative to the reference numerals of FIG. 4. For example, as with FIG. 4, the thermal management system 200 of FIG. 5 can comprise a liquid cooling system configured to transfer thermal energy away from heat sources, such as electronic components 202*a*, 202*b*. Unlike the embodiment of FIG. 4, however, which illustrated a balanced thermal system, the embodiment of FIG. 5 illustrates an unbalanced thermal system.

As shown in FIG. 5, the first and second thermal pathways 217*a*, 217*b* may not be independent or isolated from one another. Rather, as shown in FIG. 5, the thermal pathways 217*a*, 217*b* may be in series with one another such that some thermal energy collected from the first heat exchanger element 203*a* can be transferred to the second heat exchanger element 203*b* by way of the second thermal pathway 217*b*. Likewise, some thermal energy from the second heat exchanger element 203*b* can be transferred back to the first heat exchanger element 203*a* by the second thermal pathway 217*b*. Beneficially, in various embodiments, the unbalanced system 200 shown in FIG. 5 may be preferable in situations in which the thermal loads are not symmetric. In the unbalanced system 200 of FIG. 5, for example, the cooler liquid can be routed to the heat exchanger 203*a* coupled to the larger heat load first, and then to the second heat exchanger 203*b* before being transferred to the radiator 206. By contrast, for balanced loads in which the thermal loads of each heat source (e.g., each component 102*a*/202*a*, 102*b*/202*b*) are approximately the same, it may be desirable to utilize the balanced system 100 of FIG. 4.

The system 200 shown in FIG. 5 can include a pump 209 driven by a motor 218. The pump 209 can comprise any suitable type of pump, such as a regenerative pump. In other embodiments, a piezoelectric pump or a centrifugal pump can be used. The motor 218 can comprise any suitable type of motor. In some embodiments, for example, the motor 218 can comprise a pancake motor, which can be relatively thin so as to fit within the small form factor of the support structure 101. In some embodiments, an output shaft of the motor 218 can be coupled with the fan 216 and the pump 209 to simultaneously rotate the fan 216 to generate airflow over the radiator 206 and the pump 209 to flow a liquid through the heat exchanger(s) 203*a* or 203*b* and the radiator 206. In some embodiments, a clutching mechanism or switching mechanism can be provided such that the system can separately drive the fan 216 and the pump 209 when the fan 216 and the pump 209 share a common motor shaft and motor 218. In some embodiments, the fan 216 and the pump 209 may each have an associated motor for separately driving the fan 216 and pump 209. The pump 209 can drive the liquid to an accumulator 208 configured to regulate the pressure of the cooling liquid to maintain the appropriate liquid volume and to avoid air pockets created by liquid evaporation during the thermal cycles. As explained in FIG. 6 below, the accumulator 208 can control (e.g., reduce or eliminate) the amount of air that results from evaporation of the coolant liquid. For example, as explained below, a pressure regulator or other device can be used to compress the liquid to avoid any air gaps or voids that are created due to evaporation.

The liquid (which may be relatively warm or hot) can be transferred to the collection radiator 206. Thermal energy from the liquid can be dissipated to the environment by way of the fins 215. In various embodiments, internal structures (e.g., baffles) within the radiator 206 can further increase the surface area to improve heat dissipation. As explained above, in some embodiments, the fan 216 can be used to accelerate the airflow to improve heat dissipation. In other embodiments, no fan may be provided. As with FIG. 4, the fill port 207*a* and the vent 207*b* can be provided. Once the heat is dissipated by the collection radiator 206, the relatively cool liquid can be transferred along the first conduit 204*a* to a first fluid inlet port 205*a* of the first heat exchanger element 203*a*. At least some thermal energy from the electronic component 202*a* can be transferred to the cooling liquid from the first heat exchanger element 203*a* so as to increase the temperature of the liquid. The liquid can then be conveyed along the third conduit 204*c* to the second heat exchanger element 203*b*. The liquid within the third conduit 204*c* that is conveyed away from the first heat exchanger 203*a* may be warmer than the liquid conveyed to the heat exchanger 203a along the first conduit 204a, but the increase in temperature may be relatively small such that the liquid entering the second heat exchanger element 203b from the third conduit 204c is relatively cool.

Thermal energy from the electronic component 202b can be transferred to the liquid, e.g., to increase the temperature of the liquid. The liquid passing within the second heat exchanger element 203b from the third conduit 204c can exit the second heat exchanger from a fluid outlet port 205g and can enter a fifth conduit 204e that loops back into a fluid inlet port 205h of the second heat exchanger element 203b. The liquid can be conveyed away from fluid outlet port 205d of the second heat exchanger element 203b by way of the fourth conduit 204d. The liquid in the fourth conduit may be warmer than the liquid conveyed to the second heat exchanger element 203b by the third conduit 204c, in view of the thermal energy transferred to the liquid by the second heat exchanger element 203b. The liquid can re-enter a fluid inlet 205f of the first heat exchanger element 203a from the second thermal pathway 217b. Thermal energy from the electronic component 202a and the first heat exchanger element 203a can further increase the temperature of the liquid. The resulting warm or hot liquid can be conveyed back to the collection radiator 206 from fluid outlet 205b by the second conduit 204b. The hot liquid can be at least partially cooled by the radiator 206 before passing through the pump 209 and accumulator 208. The liquid can be additionally cooled by the radiator 206 after passing through the pump 209 and accumulator 208.

In some embodiments, the electronic component(s) 202a may be generate more heat (or may be hotter than) the electronic component(s) 202b. Thermally coupling the hotter component 202a to the first upstream heat exchanger element 203a can improve heat dissipation, since more thermal energy can be removed by the first heat exchanger element 203a than by the second heat exchanger element 203b, which may enable the system 200 to cool both the first and second components 202a, 202b in an effective manner. Similarly, if the VR or AR device is configured to select which electronic component 202a or 202b is to be used, or is configured to select relative processing loads for the electronic components 202a, 202b, then the system 200 can be configured to apply a higher processing load on the component 202a than the component 202b, since thermal energy may be dissipated more efficiently by the first heat exchanger element 203a than by the second heat exchanger element 203b. In some embodiments, the first upstream heat exchanger element 203a can be made smaller than (or can be made to remove less heat than) the second heat exchanger element 203b, so that each heat exchanger element 203a, 203b can be configured to remove approximately the same amount of thermal energy (or a predetermined relative amount of thermal energy). In other embodiments, the heat exchanger elements 203a, 203b can have approximately the same thermal dissipation capabilities or sizes.

Figure 6:
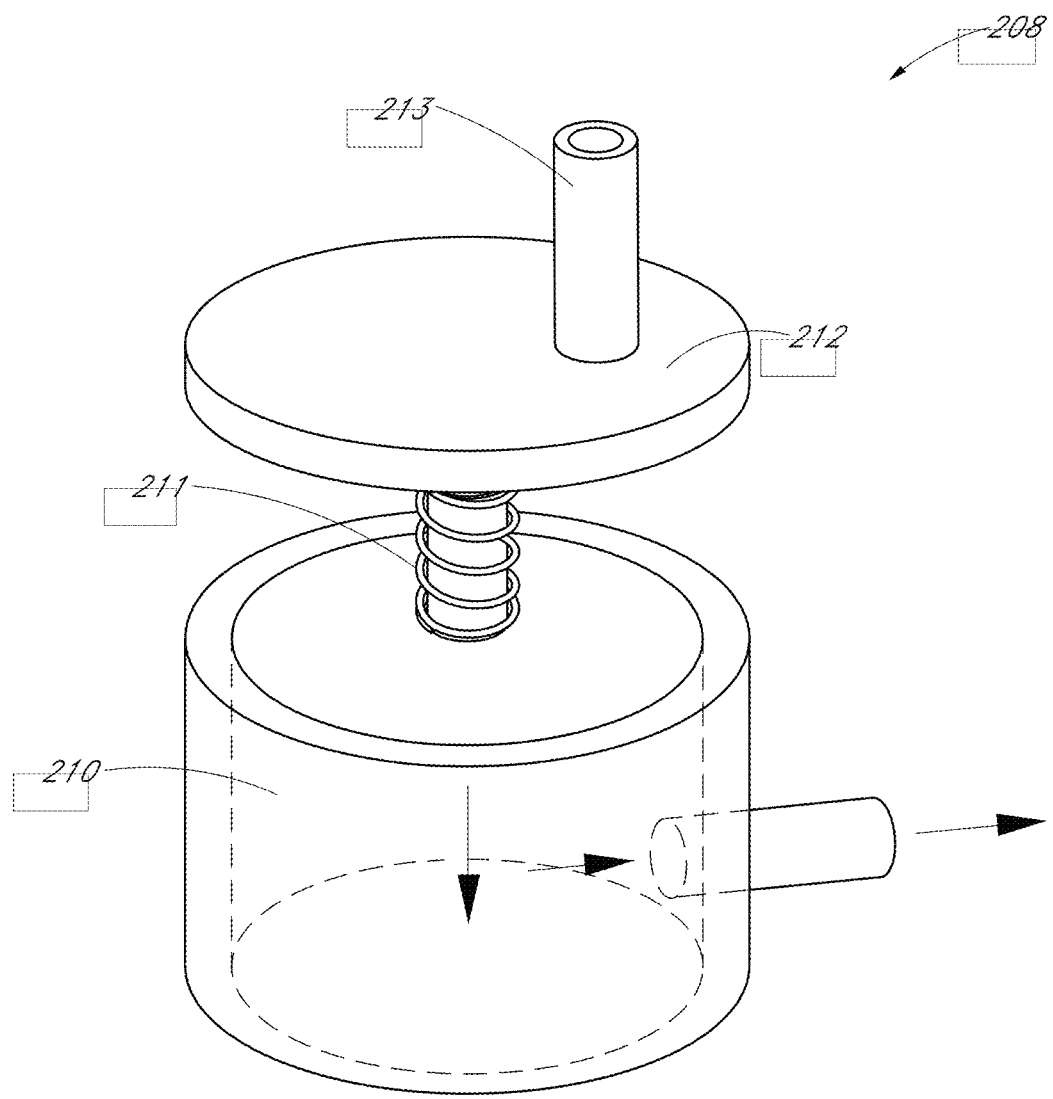
FIG. 6 is a schematic view of an accumulator shown in FIG. 5.

FIG. 6 is a schematic view of the accumulator 208 of FIG. 5. Although shown in FIG. 6, the accumulator 208 can also be used in conjunction with the system 100 shown in FIG. 4. When the thermal management systems 100 or 200 are disposed in the support structure 101 of a head mounted component 58, 58A, the user may move such that bubbles may be displaced from the liquid. Moreover, the heating of the liquid inside the systems 100 or 200 may lead to evaporation and further displacement of air or gas. It can be desirable to limit or control (e.g., prevent) the amount of air that passes through the system 100 or 200.

The accumulator 208 of FIG. 6 can include a pressure chamber 210 through which the liquid is conveyed from the pump 209. A cap 212 can be slidably engaged with the pressure chamber 210 by way of a spring 211 or other deformable element. The accumulator 208 can comprise a valve 213, such as a one-way vent or valve, that allows air into the accumulator 208 but does not allow air to escape. As the liquid evaporates, or as air or gas is otherwise displaced from the liquid, air from the outside environs enters the valve 213 to compress the liquid and air with the cap 212 to compensate for any voids or gaps that result from evaporation or movement. In various embodiments, the amount of evaporation of liquid can be measured so as to predict when the device 208 should be serviced.

Figure 7:
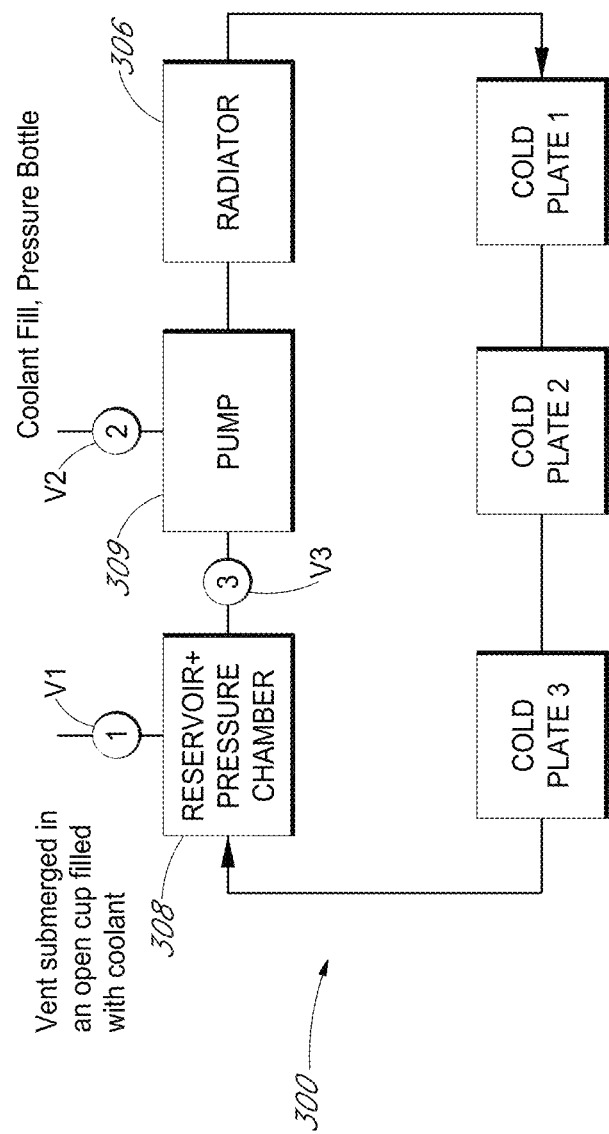
FIG. 7 is a schematic system diagram showing a portion of a thermal management system used for filling the system with a cooling liquid, according to various embodiments.

FIG. 7 is a schematic system diagram showing a portion of a thermal management system 300 used for filling the system 300 with a cooling liquid, according to various embodiments. Unless otherwise noted, the components of FIG. 7 may be generally similar to or the same as like numbered components of FIG. 5, with the reference numerals incremented by 100 relative to the reference numerals of FIG. 5. For example, as with FIG. 5, the system 300 can include an accumulator 308 that can include a reservoir and a pressure chamber, a pump 309, and a radiator 306. A first valve V1 can selectively control the flow of liquid to the accumulator 308. A second valve V2 can selectively control the flow of liquid to the pump 309. A third valve V3 can selectively control the flow of liquid between the accumulator 308 and the pump 309.

In various embodiments, the thermal management system 300 (and/or the system 100, 200) can be filled with a cooling liquid by placing the first and second valve V1, V2 in an open configuration and by placing the third valve V3 in a closed configuration. Coolant liquid can be supplied through the second valve V2 and into the pump 309 by way of a fill port (similar to fill port 107a, 207a). A vent (similar to vent 107b, 207b) can be submerged in an open reservoir filled with coolant. The pressure of the coolant liquid being supplied to the system 300 can force air out through the vent. The third valve V3 can be opened to allow liquid to pass between the accumulator 308 and the pump 309, and additional coolant liquid can be added as desired. To test the system 300, the first and second valves V1, V2 can be closed, and the pump 309 can be activated to run the system 300. If air bubbles are observed, or if the pump 309 experiences cavitation, then additional liquid can be supplied as explained herein.

Additional Considerations

Any processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A wearable electronic device comprising:
   a support structure;
   an electronic component disposed in or on the support structure;
   a heat exchanger thermally coupled with the electronic component, the heat exchanger comprising a fluid inlet port and a fluid outlet port;
   a first conduit fluidly connected to the fluid inlet port of the heat exchanger, the first conduit configured to convey, to the heat exchanger, a liquid at a first temperature;
   a second conduit fluidly connected to the fluid outlet port of the heat exchanger, the second conduit configured to convey, away from the heat exchanger, the liquid at a second temperature different from the first temperature; and
   an accumulator configured to reduce an amount of air in the liquid, wherein the accumulator includes:
      a container configured to retain at least a portion of the liquid;
      a closure device configured to remain at a top level of the liquid regardless of the volume of the liquid medium; and
      a spring coupled with the closure device to maintain the closure device at the top level of the liquid.

2. The wearable electronic device of claim 1, further comprising a pump in fluid communication with the first conduit and/or the second conduit.

3. The wearable electronic device of claim 2, wherein the pump comprises at least one of a piezoelectric pump and a centrifugal pump.

4. The wearable electronic device of claim 2, further comprising a motor configured to drive the pump.

5. The wearable electronic device of claim 4, wherein the motor comprises a pancake motor.

6. The wearable electronic device of claim 1 wherein the liquid comprises water and propylene glycol.

7. The wearable electronic device of claim 1, wherein the accumulator comprises a pressure regulator.

8. The wearable electronic device of claim 1, wherein the accumulator comprises a pressure chamber.

9. The wearable electronic device of claim 1, further comprising a radiator in fluid communication with the first conduit or with the second conduit, the radiator having fins, whereby heat in the liquid is transferred from the liquid to the radiator and heat in the radiator is transferred from the radiator to air surrounding the radiator.

10. The wearable electronic device of claim 9, further comprising a one-way valve in fluid communication with an accumulator.

11. The wearable electronic device of claim 1, wherein the electronic component is a first electronic component and the heat exchanger is a first heat exchanger, the wearable electronic device further comprising:
    a second electronic component;
    a second heat exchanger; and
    a third conduit fluidly connected to a fluid inlet port of the second heat exchanger, the third conduit configured to convey, to the second heat exchanger, the liquid at a third temperature; and
    a fourth conduit fluidly connected to a fluid outlet port of the second heat exchanger, the fourth conduit configured to convey, away from the second heat exchanger, the liquid at a fourth temperature different from the third temperature.

12. The wearable electronic device of claim 11, wherein the third conduit provides fluid communication between the fluid inlet port of the second heat exchanger and a second fluid outlet port of the first heat exchanger.

13. The wearable electronic device of claim 12, wherein the fourth conduit provides fluid communication between the fluid outlet port of the second heat exchanger and a second fluid inlet port of the first heat exchanger.

14. The wearable electronic device of claim 12, further comprising a fifth conduit extending between a second fluid outlet port of the second heat exchanger and a second fluid inlet port of the second heat exchanger.

15. The wearable electronic device of claim 1, wherein the first and second conduits extend between the first heat exchanger and a radiator.

* * * * *